April 12, 1960

V. F. DAHLGREN 2,932,599

METHOD OF PREPARATION OF THERMOPLASTIC RESIN COATED PRINTED CIRCUIT

Filed May 9, 1955

Victor F. Dahlgren
*INVENTOR.*

BY Richard P. Schulze

Attorney 2,932,599

METHOD OF PREPARATION OF THERMOPLASTIC RESIN COATED PRINTED CIRCUIT

Victor F. Dahlgren, West Windham, N.H., assignor, by mesne assignments, to Sanders Associates, Incorporated, Nashua, N.H., a corporation of Delaware Application May 9, 1955, Serial No. 507,032

10 Claims. (Cl. 154—129)

The present invention relates to printed circuits. More particularly, the invention relates to printed circuits covered with insulating material.

In the prior art, printed circuits are typically formed by affixing thin copper sheets with a suitable adhesive to an insulator base formed from a thermosetting resin such as XXXP-Phenolic (a paper base, phenolic resin laminate). The copper is then etched away, leaving a conductive pattern in the configuration of the desired circuit. Thermosetting resins are characteristically excessively hygroscopic. Under high humidity conditions, insulation resistance between conductors is substantially reduced. A relatively new material, tri-fluoro-chloro-ethylene, termed herein "Kel–F," as trade marked and manufactured by the M. W. Kellogg Company, is substantially superior to such thermosetting resin material in that it has a very low permeability to humidity as well as enhanced insulation resistance. It has been a great problem to find a suitable means for causing Kel–F to adhere to other systems.

In my copending application filed October 1, 1954, Serial No. 459,841, a method is disclosed for causing copper to adhere to Kel–F. In U.S. Patent No. 2,551,591 issued to S. G. Foord, May 8, 1951, a method is disclosed for bonding polyethylene to copper by means of a layer of cuprous oxide. Foord expressly omits the use of cupric oxide which is essential to the present invention.

It is an object of the present invention to provide an improved method of bonding thermosetting resins to thermoplastic resins.

It is a further object of the present invention to provide a method of bonding Kel–F to a phenolic resin laminate.

A still further object of the invention is to provide an improved method for insulating a printed circuit with Kel–F.

It is a further object of the invention to provide an improved printed circuit insulated with Kel–F.

Other and further objects of the invention will be apparent from the following description of preferred methods and embodiments thereof, taken in connection with the accompanying drawing.

In accordance with the invention there is presented a method of bonding plastic resin having substantially different flow characteristics relative to temperature. In accordance with the method a surface of a body of copper is oxidized to provide a coating of primarily black cupric oxide. The oxide coated copper surface is placed in contact with a surface of first plastic resin having a flow characteristic at a given temperature. The plastic and cooper are laminated together by means of a sufficient degree of heat and pressure to form thereby an imprint of the cupric oxide in the plastic. The laminated copper plastic is then cooled. The cupric oxide coated cooper is removed from the plastic to expose the plurality of randomly disposed follicles in said plastic provided by the imprint. A surface of a second plastic resin having a greater tendency to flow at a temperature substantially less than the given temperature is placed in contact with the imprinted surface. The plastic resins are pressed together at a temperature substantially less than the given temperature to force the second plastic resin into the follicles to provide a bond therebetween.

In accordance with the invention there is further provided a method of bonding a thermoplastic resin to a thermosetting resin. The method comprises oxidizing the surfaces of a thin sheet of copper to provide the surfaces with a homogeneous coating of black cupric oxide. The cupric oxide coated copper sheet is placed in contact with an uncured sheet of thermosetting resin. A sufficient degree of heat and pressure is applied to cure the thermosetting resin and press the copper and the thermosetting resin sheets together, forming thereby an imprint of the cupric oxide in the thermosetting resin. The cupric oxide coated copper clad resin sheet is then cooled. Cupric oxide coated copper is removed from the resin sheet to expose the plurality of randomly disposed follicles in the resin provided by the imprint. The thermoplastic resin is placed in contact with the imprinted surface. A sufficient degree of heat and pressure is applied to the thermoplastic and thermosetting resins to force the thermoplastic resin into the follicles. The thermoplastic and thermosetting resins are then cooled to provide the bond therebetween.

In another embodiment of the invention there is provided a method of insulating a printed circuit with tri-fluoro-chloro-ethylene. The method comprises immersing a thin sheet of clean copper in an oxidizing bath comprising a hot aqueous solution consisting essentially of an alkali selected from the group consisting of sodium hydroxide and potassium hydroxide and a chlorite selected from the group consisting of sodium chlorite and potassium chlorite to provide the copper with a homogeneous coating of black cupric oxide. The oxidized copper sheet is placed in contact with an uncured sheet of phenolic resin laminate. A predetermined degree of heat and pressure is applied to the sheets to cure the resin and press the copper and resin sheets together, forming thereby an imprint of the cupric oxide in the resin. The cupric oxide coated copper clad phenolic laminate is then cooled. Cupric oxide coated copper is removed from the sheet of phenolic laminate to expose the plurality of follicles in the resin provided by the imprint. A sheet of tri-fluoro-chloro-ethylene is placed in contact with the imprinted surface of the phenolic laminate. A sufficient degree of heat and pressure is applied to the tri-fluoro-chloro-ethylene and phenolic laminate to force the tri-fluoro-chloro-ethylene into the follicles. The tri-fluoro-chloro-ethylene and phenolic laminate are then cooled to provide the bond therebetween.

Further, in accordance with the invention there is provided, as an article of manufacture, an insulated printed circuit. The circuit comprises a sheet of phenolic resin paper laminate to the surface of which are affixed thin cupric oxide coated copper conductors. An insulating cover sheet of tri-fluoro-chloro-ethylene is bonded to the laminate and the copper conductors with the conductors held in insulated spaced relation between the sheets.

Figures 1, 2, 3, 4, 5:
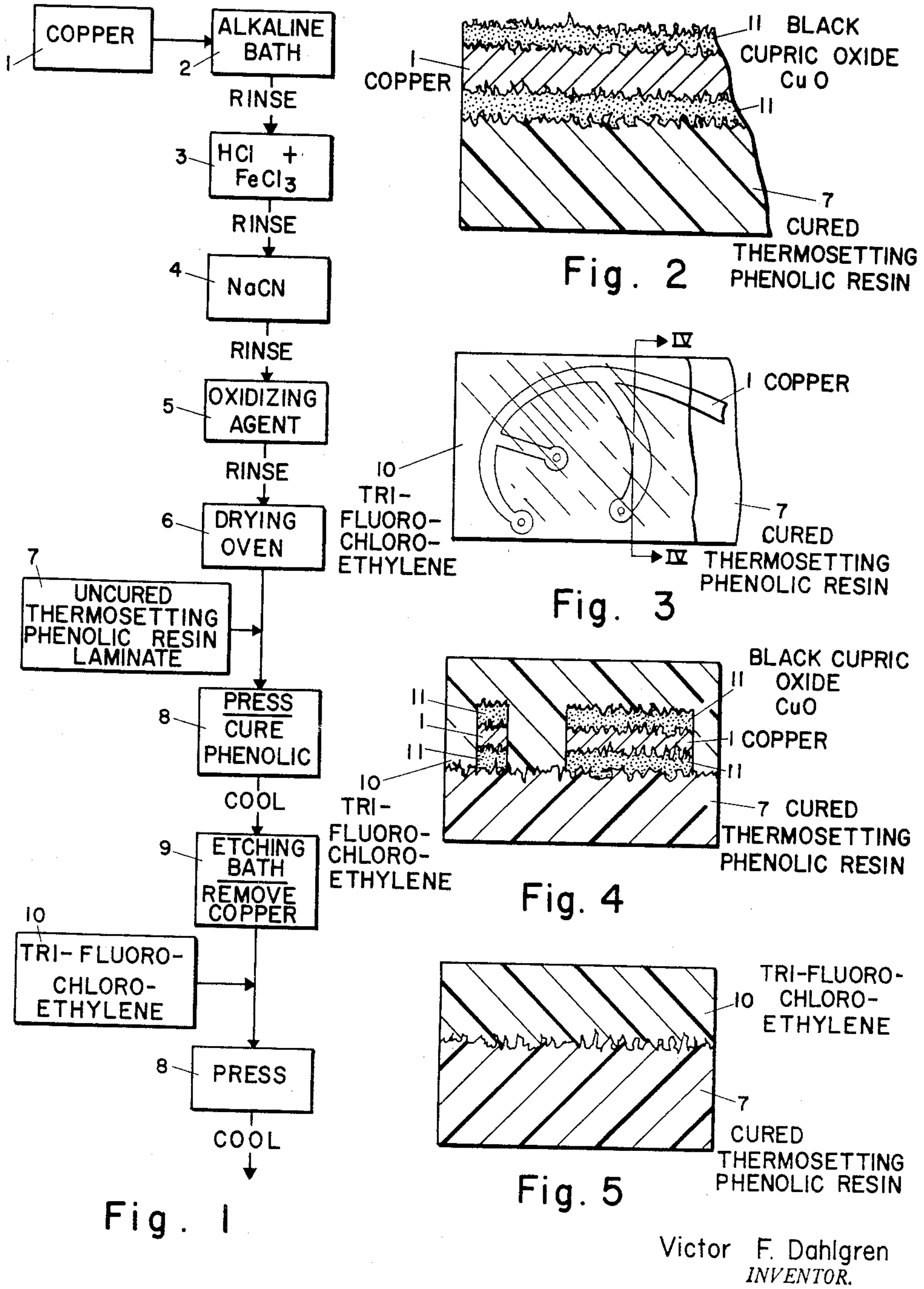
Fig. 1 is a flow chart illustrating the preferred method of the invention.
Fig. 2 is a sectional view of cupric oxide coated copper clad phenolic resin.
Fig. 3 is a plan view of a Kel–F-coated printed circuit.
Fig. 4 is a sectional view of the printed circuit taken along the lines IV—IV in Fig. 3.
Fig. 5 is a sectional view of a sheet of Kel–F bonded to a thermosetting resin.

Referring now to the drawing and with particular reference to Fig. 1, the thin sheets of copper 1 are first prepared in the following manner:

(1) Immersing the sheets of copper 1 in a mild alkaline bath 2 such as Dy-Clene EW Metal Cleaner, as manufactured by MacDermid, Inc., Waterbury, Connecticut for five seconds;

(2) Rinsing in cold, running water for five seconds;

(3) Dipping for 15 seconds in a 10 percent solution 3 of hydrochloric acid (HCl) which has dissolved in it 8 ounces per gallon of ferric chloride ($FeCl_3$);

(4) Rinsing in cold, running water for five seconds;

(5) Immersing in a 10 percent solution 4 of sodium cyanide (NaCN) for 15 seconds;

(6) Rinsing in cold, running water;

(7) Immersing in an oxidizing agent 5, such as a solution of 1½ pounds per gallon of water of Ebonol "C" Special as manufactured by Enthone Company, New Haven, Connecticut, for 10 minutes at 190–205° F. to provide a homogeneous coating of black cupric oxide (CuO) on the copper surfaces. The Ebonol "C" Special is substantially described in U.S. Patent #2,364,993 issued to Walter R. Meyer;

(8) Immersing in cold, running water;

(9) Rinsing in hot, running water for 10 to 20 seconds;

(10) Baking in a preheated oven 6 above 212° F. until all traces of moisture are removed.

The sheets of cupric oxide coated copper are bonded to a thermosetting resin, for example, a laminate of paper impregnated with a phenolic resin such as XXXP-Phenolic, in the following manner:

(11) Placing a sheet of metallic foil, such as aluminum, on the platen of a press 8, such as manufactured by Wabash Press Company, Wabash, Indiana. The aluminum foil is used to prevent adherences between the XXXP-Phenolic and the platen;

(12) Placing, for example, six stacked sheets of uncured XXXP-type phenolic resin impregnated paper, each, for example, 6 inches long, 2 inches wide and .010 of an inch thick, on the aluminum foil to provide an uncured thermosetting laminate 7;

(13) Placing the cupric oxide coated sheet of copper in contact with the sheets of resin impregnated paper and applying 300–1000 pounds per square inch of pressure;

(14) Baking at 300–350° F. under pressure for 20 minutes to cure the resin and provide the cupric oxide imprint in the resin of the top sheet of the laminate;

(15) Water cooling the copper and resin laminate under maintained pressure in the press to prevent blistering of the XXXP-resin;

(16) Removing the cupric oxide coated copper clad resin laminate from the press 8 and the aluminum foil from the laminate.

The XXXP-Phenolic may, of course, be copper clad on both sides merely by placing sheets of copper both above and below the sheets of impregnated paper. The cupric oxide coated copper clad phenolic sheet is shown in crosssection in Fig. 2. The cupric oxide shown is greatly magnified to more clearly illustrate its imprint upon the phenolic resin. The cupric oxide coated copper clad phenolic laminate is then prepared to provide a printed circuit in the desired configuration and immersed, for example, in an acid etching bath 9 in accordance with well-known, conventional photoetching techniques.

The printed circuit thus prepared is covered with an insulating sheet 10 of Kel–F in the following manner:

(17) Placing the printed circuit on the platen of the press 8;

(18) Placing a sheet of Kel–F, for example, 6 inches long, 2 inches wide and .002 of an inch thick, over the printed circuit;

(19) Applying sufficient pressure to prevent the XXXP from blistering, for example 5 pounds per square inch pressure with the press 8;

(20) Baking at a temperature in excess of 215° C. for 40 seconds to force the Kel–F into the exposed follicles in the resin provided by the imprint of the removed cupric oxide coated copper;

(21) Water cooling the printed circuit in the press; and

(22) Removing the Kel–F insulated printed circuit from the press.

In Fig. 3 a plan view of the insulated printed circuit is shown. The Kel–F inside diameter is shown incomplete to expose the copper 1 and cured thermosetting phenolic resin laminate 7. In the sectional view of Fig. 4, the cupric oxide, CuO, coating 11 is shown greatly magnified.

It will be apparent that in place of the resin-impregnated paper, an epoxy resin or silicone resin may just as well be used. In the place of the impregnated paper, impregnated glass cloth may be used to withstand higher temperature operation.

It has been found that polytetrafluoroethylene, familiarly termed "Teflon" as trade marked and manufactured by E. I. du Pont de Nemours and Company, may be utilized in place of the Kel–F at a press temperature of approximately 625° F.

In Fig. 5 the cross-section of lamination of a thermoplastic resin and a thermosetting resin is shown. Cured or thermoset phenolic resin 7 is bonded to tri-fluoro-chloro-ethylene 10 as illustrated.

The use of a thermoplastic overcoat of the type described to encapsulate printed circuits greatly decreases the hygroscopic characteristics of commonly used thermosetting plastic materials by cutting down their exposed surface areas. Teflon or Kel–F insulating coatings increase the resistivity between electrical conductors on the surface of a printed circuit. The Teflon or Kel–F insulating coating may be utilized as a resist mask for plating and soldering purposes. Such coatings permit sealing joints as between a baseplate and a printed circuit cable, whereby soldering and sealing can be accomplished simultaneously. The present invention naturally lends itself to flush mounting of printed circuits.

While there has been hereinbefore described what are at present considered preferred embodiments of the invention, it will be apparent that many and various changes and modifications may be made with respect to the embodiments illustrated, without departing from the spirit of the invention. It will be understood, therefore, that all such changes and modifications as fall fairly within the scope of the present invention, as defined in the appended claims, are to be considered as a part of the present invention.

What is claimed is:

1. The method of bonding a thermoplastic resin to a thermosetting resin comprising, oxidizing the surfaces of a thin sheet of copper to provide said surfaces with a homogeneous coating of black cupric oxide; placing said cupric oxide coated copper sheet in contact with an uncured sheet of thermosetting resin; applying a sufficient degree of heat and pressure to cure said thermosetting resin and press said copper and said thermosetting resin sheets together, forming thereby an imprint of said cupric oxide in said thermosetting resin; cooling said cupric oxide coated copper clad resin sheet; removing cupric oxide coated copper from said resin sheet to expose the plurality of randomly disposed follicles in said resin provided by said imprint; placing said thermoplastic resin in contact with said imprinted surface; and applying a sufficient degree of heat and pressure to said thermoplastic and thermosetting resins to force said thermoplastic resin into said follicles to provide said bond therebetween.

2. The method of bonding tri-fluoro-chloro-ethylene to a phenolic resin laminate comprising, immersing a thin sheet of clean copper in an oxidizing bath to provide the copper with a homogeneous coating of black cupric oxide; placing said oxidized copper sheet in contact with an uncured sheet of phenolic resin laminate; applying a predetermined degree of heat and pressure to cure said phenolic resin and press said copper and phenolic laminate sheet together, forming thereby an imprint of said cupric oxide in said laminate; cooling said cupric oxide coated copper clad phenolic laminate; removing cupric oxide coated copper from said sheet of phenolic laminate to expose the plurality of follicles in said phenolic laminate sheet provided by said imprint; placing tri-fluoro-chloro-ethylene in contact with said imprinted surface of said phenolic laminate; applying a sufficient degree of heat and pressure to said tri-fluoro-chloro-ethylene and said phenolic laminate to force said tri-fluoro-chloro-ethylene into said follicles; and cooling said tri-fluoro-chloro-ethylene and phenolic laminate to provide said bond therebetween.

3. The method of insulating a printed circuit with tri-fluoro-chloro-ethylene comprising, immersing a thin sheet of clean copper in an oxidizing bath to provide the copper with a homogeneous coating of black cupric oxide; placing said oxidized copper sheet in contact with an uncured sheet of phenolic resin laminate; applying a predetermined degree of heat and pressure to cure said resin and press said copper and resin sheets together, forming thereby an imprint of said cupric oxide in said resin; cooling said cupric oxide coated copper clad phenolic laminate; removing selected areas of cupric oxide coated copper from said sheet of phenolic laminate to provide a predetermined conductive pattern and expose the plurality of follicles in said phenolic laminate sheet formed by the exposed areas of said imprint; placing tri-fluoro-chloro-ethylene in contact with said imprinted surface of said phenolic laminate; applying a sufficient degree of heat and pressure to said tri-fluoro-chloro-ethylene and said phenolic laminate to force said tri-fluoro-chloro-ethylene into said follicles; and cooling said tri-fluoro-chloro-ethylene and phenolic laminate to provide said bond therebetween.

4. The method of bonding a thermoplastic resin to a thermosetting resin comprising, immersing a thin sheet of clean copper in an oxidizing bath comprising a hot aqueous solution consisting essentially of an alkali selected from the group consisting of sodium hydroxide and potassium hydroxide and a chlorite selected from the group consisting of sodium chlorite and potassium chlorite to provide said surfaces with a homogeneous coating of black cupric oxide; placing said cupric oxide coated copper sheet in contact with an uncured sheet of thermosetting resin; applying a sufficient degree of heat and pressure to said thermosetting resin and press said copper and thermosetting resin sheets together, forming thereby an imprint of said cupric oxide in said thermosetting resin; cooling said cupric oxide coated copper clad resin sheet; removing cupric oxide coated copper from said resin sheet to expose the plurality of randomly disposed follicles in said resin provided by said imprint; placing said thermoplastic resin in contact with said imprinted surface; applying a sufficient degree of heat and pressure to said thermoplastic and thermosetting resins to force said thermoplastic resin into said follicles; and cooling said thermoplastic and thermosetting resins to provide said bond therebetween.

5. The method of insulating a printed circuit with tri-fluoro-chloro-ethylene comprising, immersing a thin sheet of clean copper in an oxidizing bath comprising a hot aqueous solution consisting essentially of an alkali selected from the group consisting of sodium hydroxide and potassium hydroxide and a chlorite selected from the group consisting of sodium chlorite and potassium chlorite to provide the copper with a homogeneous coating of black cupric oxide; placing said oxidized copper sheet in contact with an uncured sheet of phenolic resin laminate; applying a predetermined degree of heat and pressure to cure said resin and press said copper and resin sheets together, forming thereby an imprint of said cupric oxide in said resin; cooling said cupric oxide coated copper clad phenolic laminate; removing selected areas of cupric oxide coated copper from said sheet of phenolic laminate to provide a predetermined conductive pattern and expose the plurality of follicles in said phenolic laminate sheet provided by the exposed areas of said imprint; placing tri-fluoro-chloro-ethylene in contact with said imprinted surface of said phenolic laminate; applying a sufficient degree of heat and pressure to said tri-fluoro-chloro-ethylene and said phenolic laminate to force said tri-fluoro-chloro-ethylene into said follicles; and cooling said tri-fluoro-chloro-ethylene and phenolic laminate to provide said bond therebetween.

6. The method of bonding plastic resins having substantially different flow characteristics relative to temperature, comprising: oxidizing a surface of a body of copper to provide a coating of primarily black cupric oxide; placing said cupric-oxide-coated-copper surface in contact with a surface of a first plastic resin having a flow characteristic at a given temperature; applying a sufficient degree of heat and pressure to laminate said plastic and copper together, forming thereby an imprint of said cupric oxide in said plastic; cooling said laminated copper plastic; removing said cupric-oxide-coated-copper from said plastic to expose the plurality of randomly disposed follicles in said plastic provided by said imprint; placing a surface of a second plastic resin having a greater tendency to flow at a temperature substantially less than said given temperature in contact with said imprinted surface; and pressing said plastic resins together at a temperature substantially less than said first given temperature to force said second plastic resin into said follicles to provide said bond therebetween.

7. The method of bonding tri-fluoro-chloro-ethylene to a thermosetting resin laminate comprising, immersing a thin sheet of clean copper in an oxidizing bath to provide the copper with a homogeneous coating of black cupric oxide; placing said oxidized copper sheet in contact with an uncured sheet of thermosetting resin laminate; applying resin laminate; applying a predetermined degree of heat and pressure to cure said resin and press said copper and laminate sheets together, forming thereby an imprint of said cupric oxide in said laminate; cooling said cupric oxide coated copper clad laminate; removing cupric oxide coated copper from said sheet of laminate to expose the plurality of follicles in said laminate sheet provided by said imprint; placing tri-fluoro-chloro-ethylene in contact with said imprinted surface of said laminate; applying a sufficient degree of heat and pressure to said tri-fluoro-chloro-ethylene and said laminate to force said tri-fluoro-chloro-ethylene into said follicles; and cooling said tri-fluoro-chloro-ethylene and laminate to provide said bond therebetween.

8. The method of bonding a thermoplastic resin to a phenolic resin laminate comprising, immersing a thin sheet of clean copper in an oxidizing bath to provide the copper with a homogeneous coating of black cupric oxide; placing said oxidized copper sheet in contact with an uncured sheet of phenolic resin laminate; applying a predetermined degree of heat and pressure to cure said phenolic resin and press said copper and phenolic laminate sheets together, forming thereby an imprint of said cupric oxide in said laminate; cooling said cupric oxide coated copper clad phenolic laminate; removing cupric oxide coated copper from said sheet of phenolic laminate to expose the plurality of follicles in said phenolic laminate sheet provided by said imprint; placing a thermoplastic resin in contact with said imprinted surface of said phenolic laminate; applying a sufficient degree of heat and pressure to said thermoplastic resin and said phenolic laminate to force said thermoplastic resin into said follicles; and cooling said thermoplastic resin and phenolic laminate to provide said bond therebetween.

9. The method of bonding poly-tetra-fluoro-ethylene to a phenolic resin laminate comprising, immersing a thin sheet of clean copper in an oxidizing bath to provide the copper with a homogeneous coating of black cupric oxide; placing said oxidized copper sheet in contact with an uncured sheet of phenolic resin laminate; applying a predetermined degree of heat and pressure to cure said phenolic resin and press said copper and phenolic laminate sheets together, forming thereby an imprint of said cupric oxide in said laminate; cooling said cupric oxide coated copper clad phenolic laminate; removing cupric oxide coated copper from said sheet of phenolic laminate to expose the plurality of follicles in said phenolic laminate sheet provided by said imprint; placing poly-tetra-fluoro-ethylene in contact with said imprinted surface of said phenolic laminate; applying a sufficient degree of heat and pressure to said poly-tetra-fluoro-ethylene and said phenolic laminate to force said poly-tetra-fluoro-ethylene into said follicles; and cooling said poly-tetra-fluoro-ethylene and phenolic laminate to provide said bond therebetween.

10. The method of bonding tri-fluoro-chloro-ethylene to an epoxy resin laminate comprising, immersing a thin sheet of clean copper in an oxidizing bath to provide the copper with a homogeneous coating of black cupric oxide; placing said oxidized copper sheet in contact with an uncured sheet of epoxy resin laminate; applying a predetermined degree of heat and pressure to cure said epoxy resin and press said copper and epoxy laminate sheets together, forming thereby an imprint of said cupric oxide in said laminate; cooling said cupric oxide coated copper clad epoxy laminate; removing cupric oxide coated copper from said sheet of epoxy laminate to expose the plurality of follicles in said epoxy laminate sheet provided by said imprint; placing tri-fluoro-chloro-ethylene in contact with said imprinted surface of said epoxy laminate; applying a sufficient degree of heat and pressure to said tri-fluoro-chloro-ethylene and said epoxy laminate to force said tri-fluoro-chloro-ethylene into said follicles; and cooling said tri-fluoro-chloro-ethylene and epoxy laminate to provide said bond therebetween.

References Cited in the file of this patent

UNITED STATES PATENTS

| | | |
|---|---|---|
| 1,954,403 | Daly | Apr. 10, 1934 |
| 2,551,591 | Foord | May 8, 1951 |
| 2,728,698 | Rudner | Dec. 27, 1955 |
| 2,745,898 | Hurd | May 15, 1956 |
| 2,768,923 | Kepple et al. | Oct. 30, 1956 |